(12) United States Patent
Song et al.

(10) Patent No.: US 10,707,851 B1
(45) Date of Patent: Jul. 7, 2020

(54) DOUBLE DATA RATE CIRCUIT AND DATA GENERATION METHOD IMPLEMENTING PRECISE DUTY CYCLE CONTROL

(71) Applicant: Yangtze Memory Technologies Co., Ltd., Wuhan, Hubei Province (CN)

(72) Inventors: Daesik Song, Wuhan (CN); Jae Hyeong Kim, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/436,887

(22) Filed: Jun. 10, 2019

Related U.S. Application Data (63) Continuation of application No. PCT/CN2019/085451, filed on May 5, 2019.

(51) Int. Cl.
| | | |
|---|---|---|
| H03M 9/00 | (2006.01) |
| H04J 3/04 | (2006.01) |
| H04J 3/06 | (2006.01) |
| H03K 17/693 | (2006.01) |
| H03K 5/156 | (2006.01) |
| G06F 1/10 | (2006.01) |

(Continued)

(52) U.S. Cl.
CPC .............. *H03K 5/1565* (2013.01); *G06F 1/06* (2013.01); *G06F 1/10* (2013.01); *H03K 19/20* (2013.01)

(58) Field of Classification Search
CPC ........ H03K 5/1565; H03K 19/20; G06F 1/10; G06F 1/06
See application file for complete search history.

(56) References Cited

U.S. PATENT DOCUMENTS 5,724,361 A   3/1998   Fiedler
6,631,144 B1  10/2003  Johansen
(Continued)

FOREIGN PATENT DOCUMENTS

CN    1435016 A    8/2003
CN    102025366 A  4/2011
(Continued)

OTHER PUBLICATIONS

Mrigank Sharad et al., "A New Double Data Rate(DDR) Dual-Mode Duobinary Transmitter Architecture", 2011 24th Annual Conference on VLSI Design, India, 2011 IEEE, pp. 12-17.

(Continued)

*Primary Examiner* — Kenneth B Wells
(74) *Attorney, Agent, or Firm* — Winston Hsu (57) ABSTRACT

A double data rate circuit includes a clock generator, a clock divider and a multiplexer. The clock generator is used to receive a source clock signal to generate a pair of complementary clock signals. The clock divider is coupled to the clock generator, and used to generate four multiphase clock signals using only single-edge transitions of the pair of complementary clock signals. The four multiphase clock signals are successively out-of-phase by 90°. The multiplexer is coupled to the clock divider, and used to multiplex multiple data bits into an output data stream by sequentially selecting and deselecting each data bit of the multiple data bits upon a first edge transition of and a second edge transition of two of the four multiphase clock signals, respectively, and outputting each selected data bit as the output data stream.

15 Claims, 10 Drawing Sheets

(51) Int. Cl.
*G06F 1/06* (2006.01)
*H03K 19/20* (2006.01)

(56) References Cited

U.S. PATENT DOCUMENTS

| | | | | |
|---|---|---|---|---|
| 6,674,772 B1 * | 1/2004 | Dally | ...................... | H04J 3/047 |
| | | | | 370/532 |
| 7,423,467 B1 | 9/2008 | Simon | | |
| 7,460,039 B2 * | 12/2008 | Jeon | ........................ | H03M 9/00 |
| | | | | 341/100 |
| 7,840,831 B2 * | 11/2010 | Jang | ...................... | H03K 5/135 |
| | | | | 327/175 |
| 7,864,084 B2 * | 1/2011 | Padaparambil | ......... | H03M 9/00 |
| | | | | 341/100 |
| 7,961,778 B2 * | 6/2011 | Buckwalter | ............ | H03K 5/135 |
| | | | | 375/226 |
| 8,094,047 B2 * | 1/2012 | King | ...................... | H03M 9/00 |
| | | | | 327/408 |
| 8,718,214 B2 * | 5/2014 | Aoki | .................. | H04L 25/0274 |
| | | | | 375/357 |
| 8,901,978 B2 | 12/2014 | Ma | | |
| 9,270,285 B2 * | 2/2016 | Kang | .................... | H03L 7/0802 |
| 9,674,025 B2 * | 6/2017 | Dickson | ................ | H04L 27/364 |
| 10,249,354 B1 | 4/2019 | Lee | | |
| 2003/0076821 A1 * | 4/2003 | Takauchi | ............. | H03K 17/693 |
| | | | | 370/366 |
| 2003/0151433 A1 | 8/2003 | Takai | | |
| 2004/0100947 A1 * | 5/2004 | Masaki | ................ | H03K 17/693 |
| | | | | 370/366 |
| 2007/0300098 A1 | 12/2007 | Chen | | |
| 2014/0071784 A1 | 3/2014 | Baliga | | |
| 2018/0062629 A1 | 3/2018 | Ma | | |

FOREIGN PATENT DOCUMENTS

| | | |
|---|---|---|
| CN | 108038068 A | 5/2018 |
| CN | 109643990 A | 4/2019 |
| KR | 10-2008-0092495 A | 10/2008 |

OTHER PUBLICATIONS

Chen Ting et al., "A high-speed Delay-Locked Loop (DLL) and Duty Cycle Corrector (DCC)", China Integrated Circuit, No. 238, China, 2019, pp. 28-30 & 34.

* cited by examiner

DOUBLE DATA RATE CIRCUIT AND DATA GENERATION METHOD IMPLEMENTING PRECISE DUTY CYCLE CONTROL

CROSS REFERENCE TO RELATED APPLICATIONS

This is a continuation of PCT patent application No. PCT/CN2019/085451, filed on 5 May 2019 and included herein by reference in its entirety.

BACKGROUND OF THE INVENTION

1. Field of the Invention

The invention relates to high-speed data processing, and specifically, to a double data rate circuit and a generation method implementing precise duty cycle control.

2. Description of the Prior Art

A double data rate (DDR) system transfers data on both the rising and falling edges of a clock signal. Accordingly, output data from a DDR circuit are aligned to the rising and falling edge of a clock signal, and therefore, the duty cycle of the clock signal has a direct impact on the data window of the output data, and a 50%-duty-cycle, low-jitter clock is essential to optimize timing performance of output data.

In the conventional art, a conventional DDR circuit often suffers from poor duty cycle of output data owing to unbalanced pull-up and pull-down drive strengths for selecting output data.

Therefore, a need for a double data rate circuit and a data generation method implementing precise duty cycle control has arisen to satisfy timing requirements, decrease a data skew, reduce an error rate and enhance system performance.

SUMMARY OF THE INVENTION

In one embodiment of the invention, a double data rate circuit which includes a clock generator, a clock divider and a multiplexer is provided. The clock generator is used to receive a source clock signal to generate a pair of complementary clock signals. The clock divider is coupled to the clock generator, and used to generate four multiphase clock signals using only single-edge transitions of the pair of complementary clock signals. The four multiphase clock signals are successively out-of-phase by 90°. The multiplexer is coupled to the clock divider, and used to multiplex multiple data bits into an output data stream by sequentially selecting and deselecting each data bit of the multiple data bits upon a first edge transition of and a second edge transition of two of the four multiphase clock signals, respectively, and outputting each selected data bit as the output data stream.

In another embodiment of the invention, a data generation method adopted by a double data rate circuit comprising a clock generator, a clock divider and a multiplexer is disclosed. The data generation method includes: the clock generator receiving a source clock signal to generate a pair of complementary clock signals; the clock divider generating four multiphase clock signals using only single-edge transitions of the pair of complementary clock signals, the four multiphase clock signals being out-of-phase by 90° with each other; and the multiplexer multiplexing multiple data bits into an output data stream by sequentially selecting and deselecting each data bit of the multiple data bits upon a first edge transition of and a second edge transition of two of the four multiphase clock signals, respectively, and outputting each selected data bit as the output data stream.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
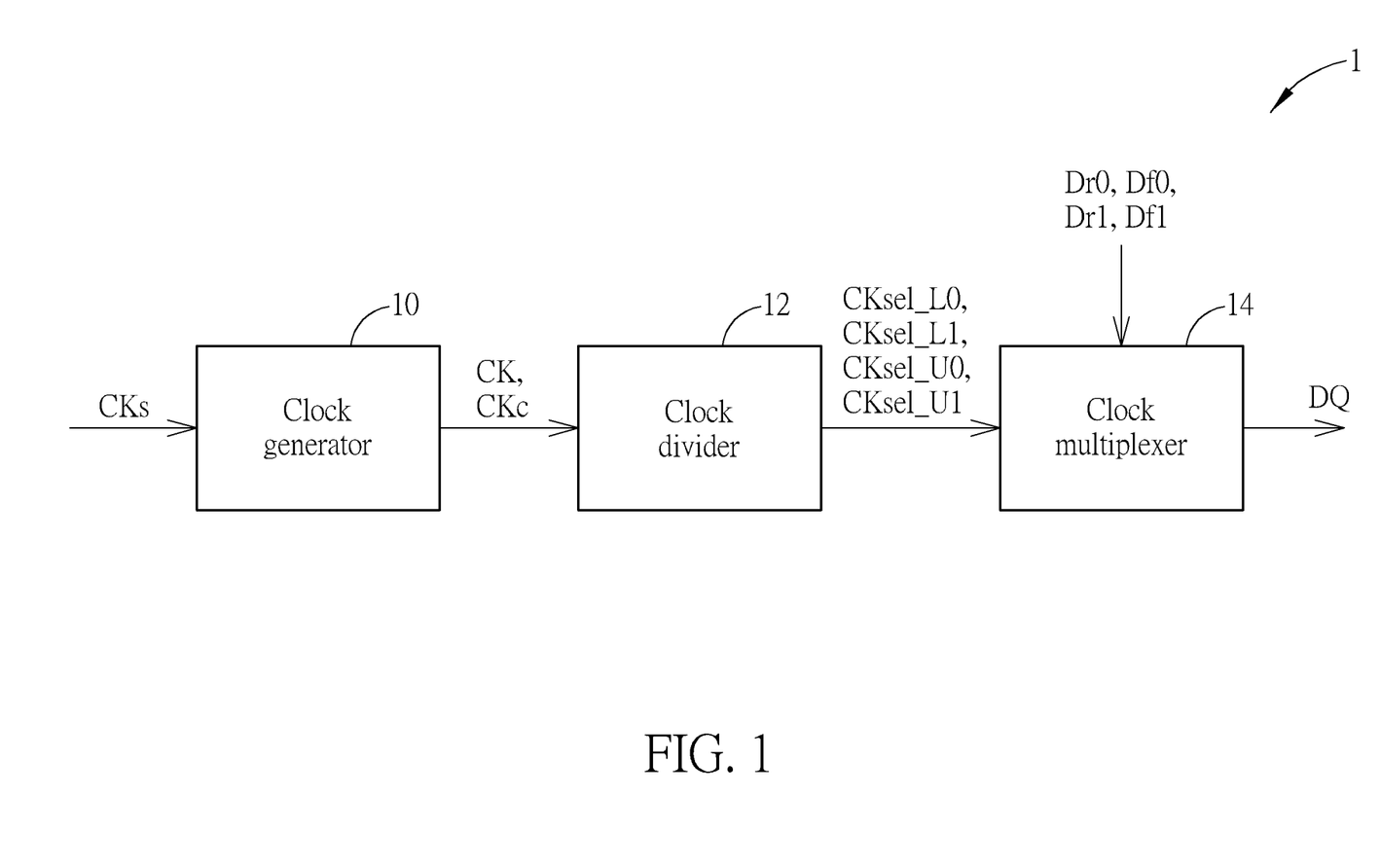
FIG. 1 is a block diagram of a double data rate circuit according to an embodiment of the invention.

FIG. 1 is a block diagram of a double data rate (DDR) circuit 1 according to an embodiment of the invention, comprising a clock generator 10, a clock divider 12 and a multiplexer 14. The clock generator 10 is coupled to the clock divider 12 and then to the multiplexer 14. The double data rate circuit 1 may receive 4 data bits Dr0, Df0, Dr1, Df1 from a baseband circuit and a source clock signal CKs from an external clock source, and multiplex the data bits Dr0, Df0, Dr1, Df1 into one data stream DQ at twice the clock rate of the source clock signal CKs. In particular, a start and an end of the multiplexing of each of the data bits Dr0, Df0, Dr1, Df1 are respectively controlled by equal quantities of signal edges, thereby reducing or eliminating a timing mismatch between the start and the end of the multiplexing owing to unbalanced pull-up and pull-down drive strengths and/or process variations. The double data rate circuit 1 may be a DDR memory controller transmitting the output data stream DQ to a DDR memory. The external clock source refers to a clock generator outside the double data rate circuit 1, and may be a crystal oscillator circuit.

More specifically, the clock generator 10 may receive the source clock signal CKs to generate a pair of complementary clock signals CK, CKc. The pair of complementary clock signals CK, CKc has a phase difference of approximately 180° with respect to each other and substantially equal timing delays with respect to the source clock signal CKs. In particular, the clock generator 10 may adopt an even number of inverters coupled in series to generate the complementary clock signal CK, and adopt an odd number of inverters coupled in series to generate the complementary clock signal CKc. A sum of the fan-outs of the even number of inverters and a sum of the fan-outs of the odd number of inverters are configured to be substantially identical to ensure the substantially equal timing delays of the pair of complementary clock signals CK, CKc.

The clock divider 12 may generate four multiphase clock signals CKsel_L0, CKsel_L1, CKsel_U0, CKsel_U1, using only single-edge transitions of the pair of complementary clock signals CK, CKc. The four multiphase clock signals CKsel_L0, CKsel_L1, CKsel_U0, CKsel_U1 are successively out-of-phase by 90°. The single-edge transitions may be rising edges or falling edges of the pair of complementary clock signals CK, CKc.

The multiplexer 14 may multiplex data bits Dr0, Df0, Dr1, Df1 into the output data stream DQ by sequentially selecting and deselecting each data bit of the data bits Dr0, Df0, Dr1, Df1 upon a first edge transition of and a second edge transition of two of the four multiphase clock signals CKsel_L0, CKsel_L1, CKsel_U0, CKsel_U1, respectively, and outputting each selected data bit as the output data stream DQ. For example, the multiplexer 14 may select a first data bit Dr0 of the data bits Dr0, Df0, Dr1, Df1 as the output data stream DQ upon the first edge transition of a first multiphase clock signal CKsel_L0 of the four multiphase clock signals CKsel_L0, CKsel_L1, CKsel_U0, CKsel_U1, and deselect the first data bit Dr0 of the data bits Dr0, Df0, Dr1, Df1 as the output data stream DQ upon the second edge transition of a second multiphase clock signal CKsel_L1 of the four multiphase clock signals CKsel_L0, CKsel_L1, CKsel_U0, CKsel_U1. The first multiphase clock signal CKsel_L0 and the second multiphase clock signal CKsel_L1 are out-of-phase by 90°. The first edge transition and the second edge transition may be opposite clock edges. For example, the first edge transition may be a rising edge and the second edge transition may be a falling edge. The other three data bits Df0, Dr1, Df1 may be selected and/or deselected based on the same principle using other combinations of two multiphase clock signals of the multiphase clock signals CKsel_L0, CKsel_L1, CKsel_U0, CKsel_U1, with the two multiphase clock signals also being out-of-phase by 90°.

Figure 2:
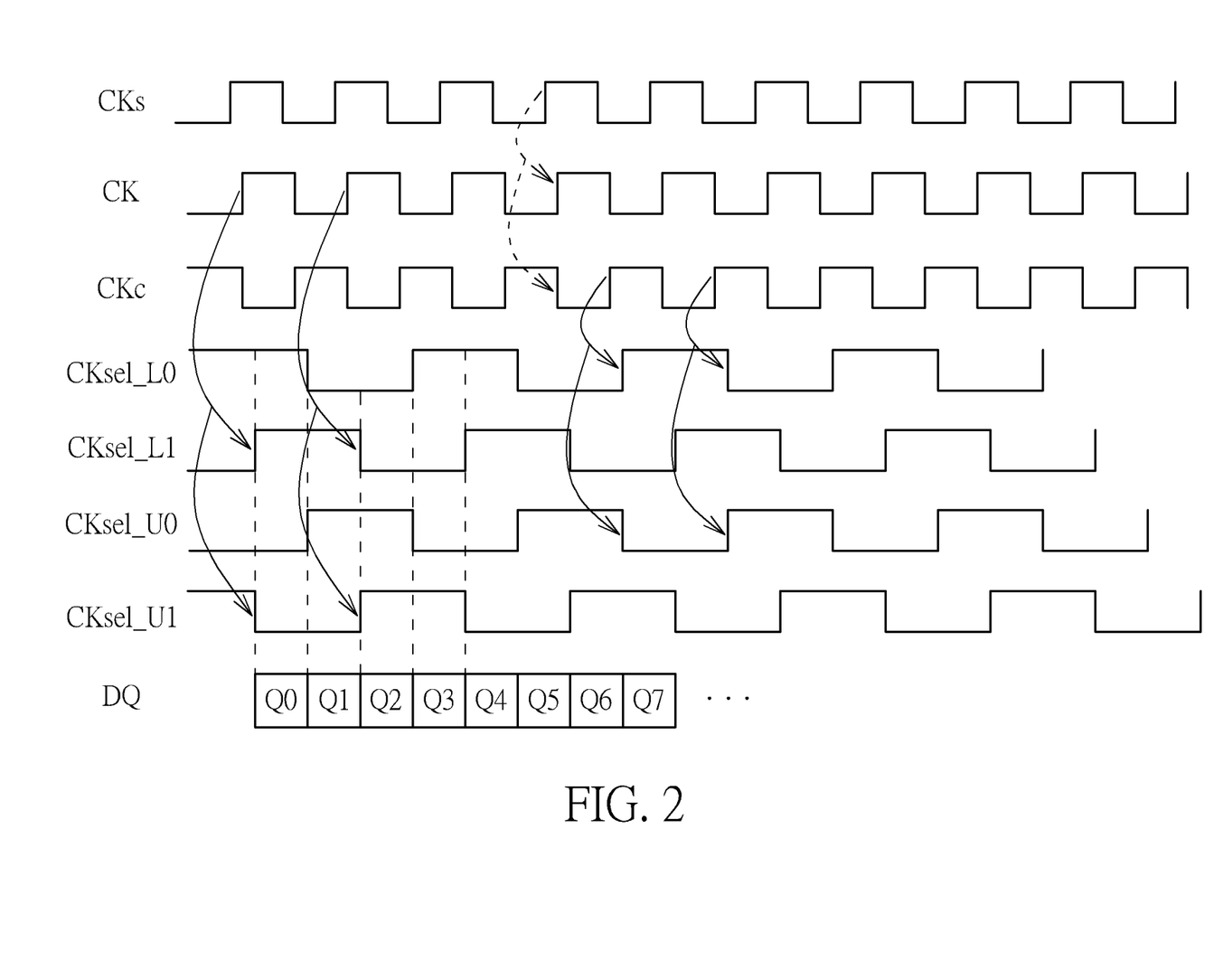
FIG. 2 is a timing diagram of the DDR circuit in FIG. 1.

FIG. 2 is a timing diagram of the DDR circuit 1, comprising the source clock signal CKs, the complementary clock signals CK, CKc, the multiphase clock signals CKsel_L0, CKsel_L1, CKsel_U0, CKsel_U1, and the output data stream DQ. The source clock signal CKs is used to generate the pair of complementary clock signals CK, CKc having substantially identical delays. Next, the complementary clock signal CK is used to generate the multiphase clock signals CKsel_L1, CKsel_U1 using the rising edges of the complementary clock signal CK, and likewise, the complementary clock signal CKc is used to generate the multiphase clock signals CKsel_L0, CKsel_U0 using rising edges of the complementary clock signal CKc. Since only the rising edges are used, the timing skews between any two of the multiphase clock signals CKsel_L0, CKsel_L1, CKsel_U0, CKsel_U1 are reduced or minimized. The multiphase clock signals CKsel_L0, CKsel_L1, CKsel_U0, CKsel_U1 are then used to multiplex the data bits Dr0, Df0, Dr1, Df1. Specifically, four pairs of multiphase clock signals may be selected from the four multiphase clock signals CKsel_L0, CKsel_L1, CKsel_U0, CKsel_U1 to combine the data bits Dr0, Df0, Dr1, Df1 into the output data stream DQ, respectively, and each pair of multiphase clock signals is out-of-phase by 90°. For example, when the pair of multiphase clock signals CKsel_L0, CKsel_L1 are both in logical state "HIGH", the data bit Dr0 may be selected as an output data bit Q0 of the output data stream DQ, and otherwise, the data bit Dr0 may be deselected. Therefore, the selection of the data bit Dr0 is triggered by the rising edge of the multiphase clock signal CKsel_L1 and deselection of the data bit Dr0 is triggered by the falling edge of the multiphase clock signal CKsel_L0. In the same manner, the data bits Df0, Dr1, Df1 may be sequentially selected as output data bits Q1, Q2, Q3 of the output data stream DQ.

Accordingly, the start of an output data bit in the output data stream DQ relies on one rising edge of a first multiphase clock signal in the four multiphase clock signals CKsel_L0, CKsel_L1, CKsel_U0, CKsel_U1, and the end of the output data bit in the output data stream DQ relies on one falling edge of a second multiphase clock signal in the four multiphase clock signals CKsel_L0, CKsel_L1, CKsel_U0, CKsel_U1, and thus, the start and the end of the output data bit are driven by substantially equal drive strengths, and any timing variation between start and end delays and any mismatch due to the process variations can be reduced or eliminated, thereby generating the output data stream DQ with enhanced duty cycle control.

The double data rate circuit 1 employs matched circuit components to further control the duty cycle of the output data stream DQ at near 50%. More specifically, the clock generator 10, the clock divider 12 and the multiplexer 14 all adopt matched structures and will be explained in detail as follows.

Figure 3:
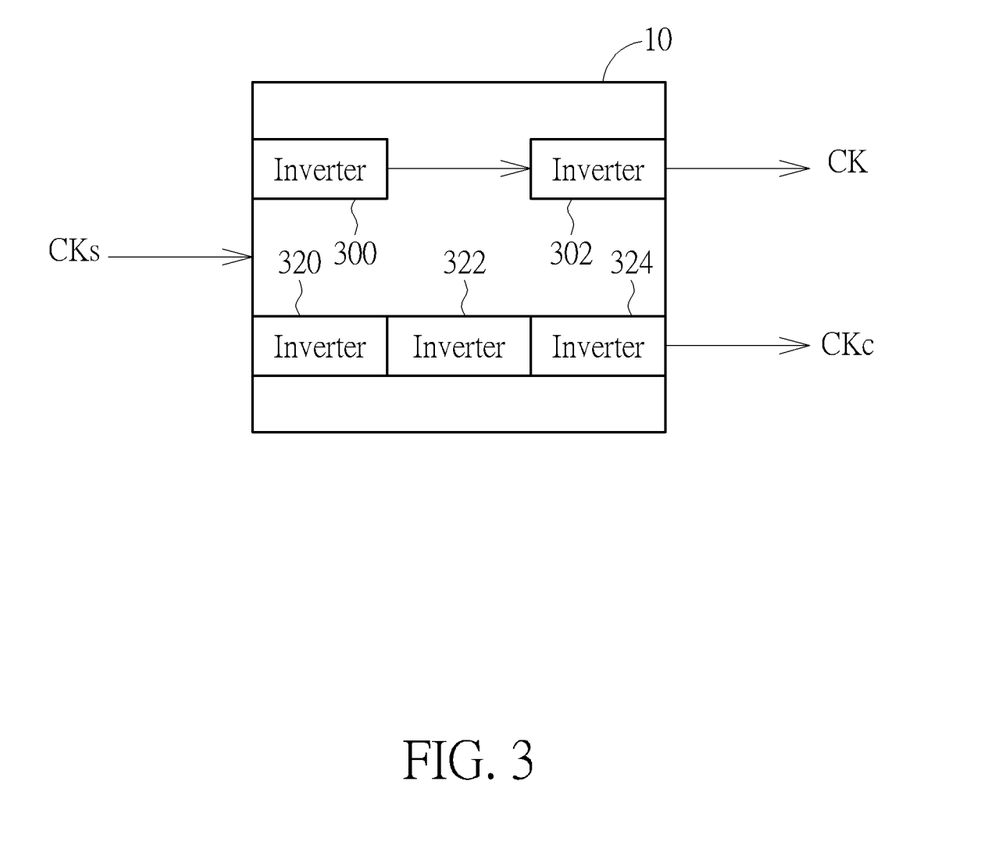
FIG. 3 is a block diagram of the clock generator in FIG. 1.

FIG. 3 is a block diagram of the clock generator 10 in FIG. 1. The clock generator 10 comprises inverters 300, 302, 320, 322, 324. The inverters 300, 302 are coupled in series to form a first clock path, and receive the source clock CKs to generate the complementary clock signal CK. Similarly, the inverters 320, 322, 324 are coupled in series to form a second clock path, and receive the source clock CKs to generate the complementary clock signal CKc. The fan-out of the inverter 300 is equal to a sum of fan-outs of the inverters 320 and 322, and can be expressed by Equation Eq(1).

$$FO(inverter\ 300) = FO(inverter\ 320) + FO(inverter\ 322) \quad Eq(1)$$

where FO( ) is the fan-out of an inverter.

Since the sums of the fan-outs of the inverters on in the first clock path and the second clock path are matched, the timing delays of the complementary clock signals CK, CKc are substantially equal. The circuit configuration ensures low or no timing skew while providing a phase difference of 180° between the complementary clock signals CK, CKc.

Figure 4:
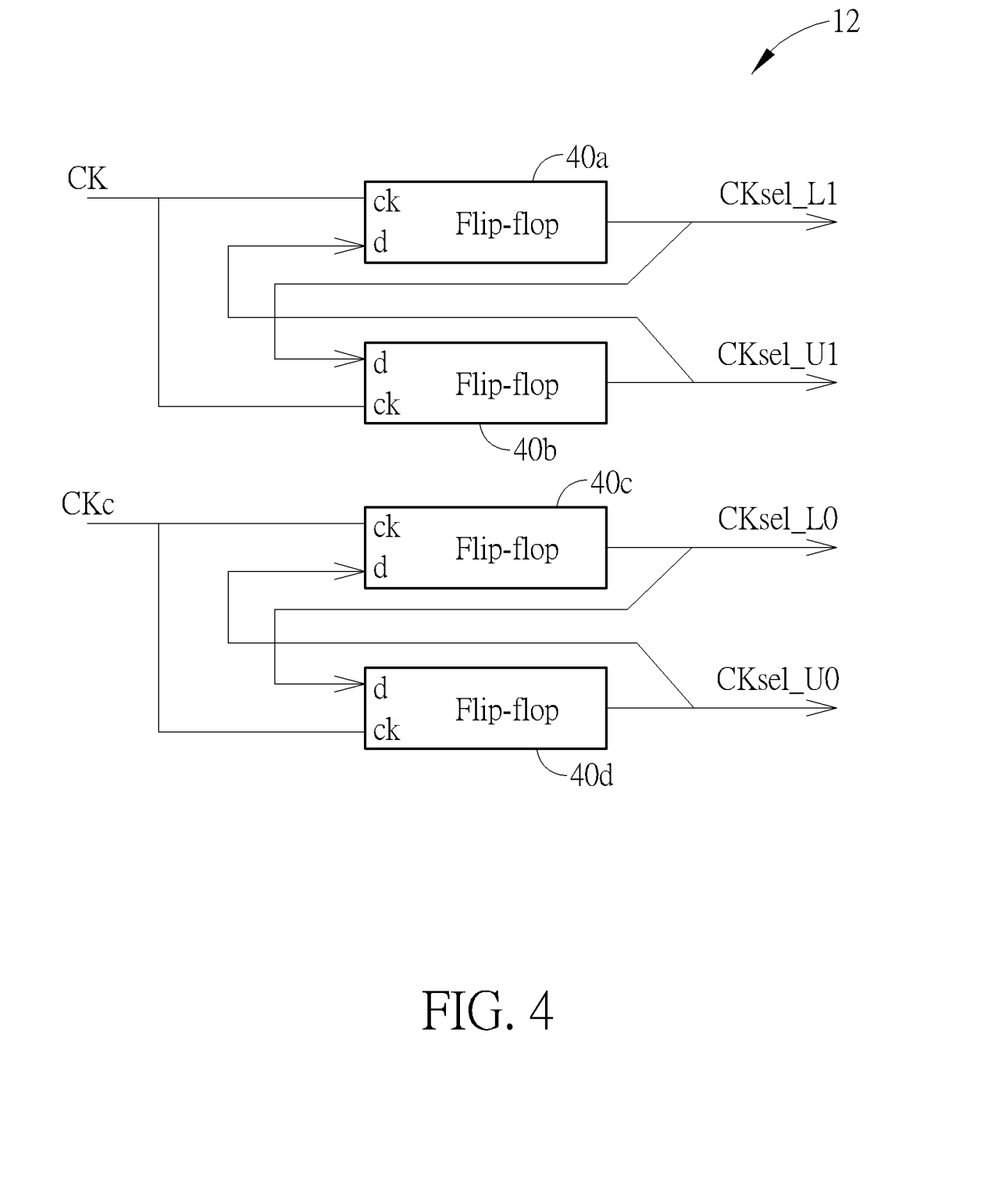
FIG. 4 is a block diagram of the clock divider in FIG. 1.

FIG. 4 is a block diagram of the clock divider 12 in FIG. 1. The clock divider 12 comprises first and second pairs of cross-coupled flip-flops. The first pair of cross-coupled flip-flops comprises a flip-flop 40a and a flip-flop 40b cross-coupled to each other and receiving the complementary clock signal CK to generate the multiphase clock signals CKsel_L1, CKsel_U1 by toggling the multiphase clock signals CKsel_L1, CKsel_U1 upon every rising edge of the complementary clock signal CK. Likewise, the second pair of cross-coupled flip-flops comprises a flip-flop 40c and a flip-flop 40d cross-coupled to each other and receiving the complementary clock signal CKc to generate the multiphase clock signals CKsel_L0, CKsel_U0 by toggling the multiphase clock signals CKsel_L0, CKsel_U0 upon every rising edge of the complementary clock signal CKc. The multiphase clock signals CKsel_L1, CKsel_U1 are opposite in phase, and the multiphase clock signals CKsel_L0, CKsel_U0 are opposite in phase.

Figure 5:
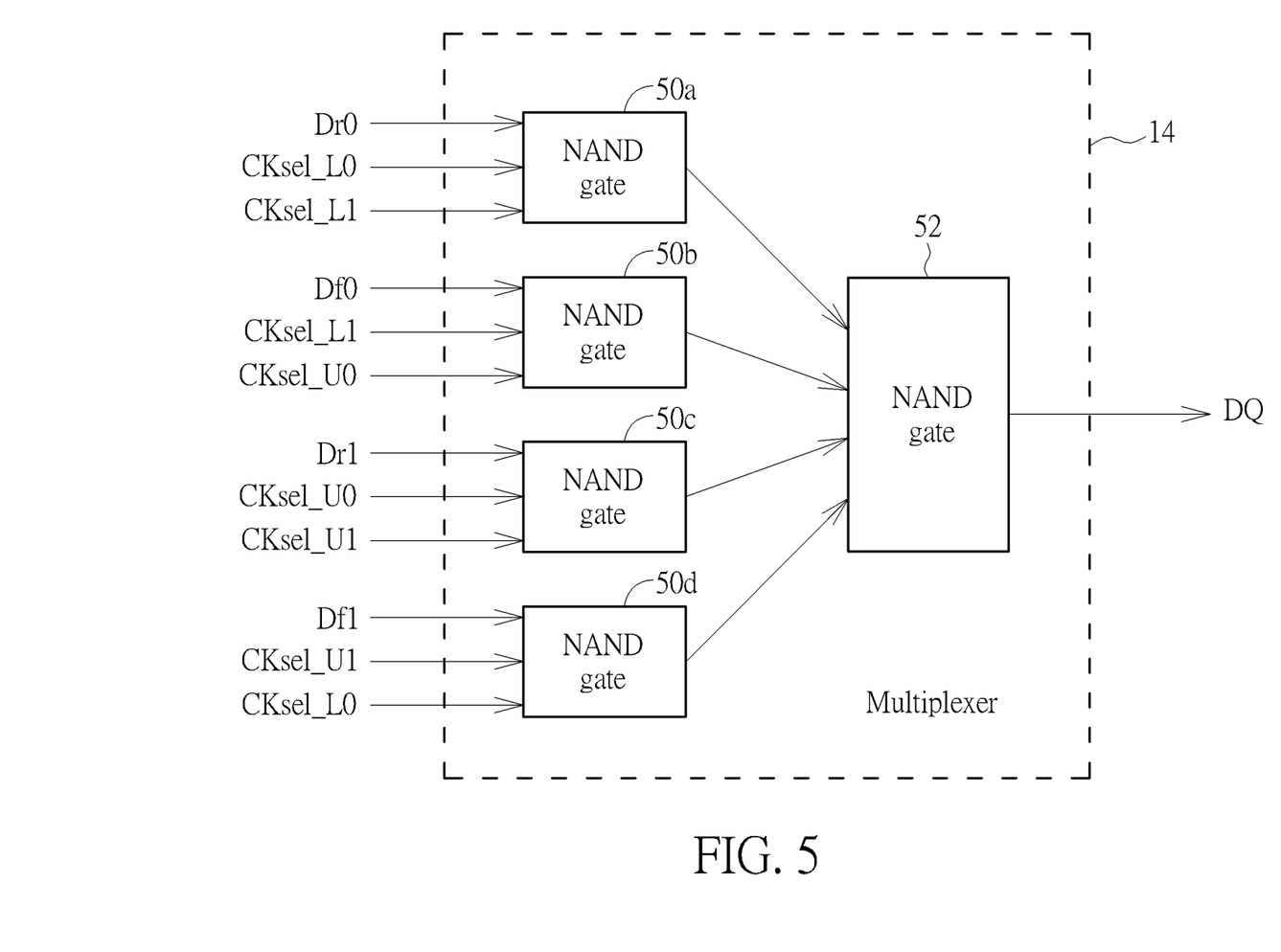
FIG. 5 is a block diagram of the multiplexer in FIG. 1.

FIG. 5 is a block diagram of the multiplexer 14 in FIG. 1. The multiplexer 14 comprises four 3-input NAND gates 50a through 50d and a 4-input NAND gate 52 coupled thereto. Each of the four 3-input NAND gates 50a through 50d is configured to receive one of the data bits Dr0, Df0, Dr1, Df1 and two of the four multiphase clock signals CKsel_L0, CKsel_L1, CKsel_U0, CKsel_U1, start outputting the received data bit upon a first edge transition of one of the two received multiphase clock signals, and stop outputting the received data bit upon a second edge transition of another one of the two received multiphase clock signals. The two received multiphase clock signals are out-of-phase by 90°. For example, the 3-input NAND gate 50*b* may receive the data bit Df0 and the multiphase clock signals CKsel_L1, CKsel_U0; upon a rising edge of the multiphase clock signal CKsel_U0, the 3-input NAND gate 50*b* may start outputting the data bit Df0; and upon a falling edge of the multiphase clock signal CKsel_L1, the 3-input NAND gate 50*b* may stop outputting the data bit Df0. The same operation principle also applies to the other 3-input NAND gates 50*a*, 50*c*, 50*d*. Since the received multiphase clock signals are out-of-phase by 90°, each data bit may be valid for a period of approximately a quarter clock cycle, and may be combined into the output data stream DQ by the 4-input NAND gate 52. When not outputting data bits, the 3-input NAND gates 50*a* through 50*d* may output a logical state "HIGH". The 4-input NAND gate 52 may receive respective output signals from the four 3-input NAND gates 50*a* through 50*d* to generate the output data stream DQ. Accordingly, the 3-input NAND gates 50*a* through 50*d* may in turn output valid data bits Dr0, Df0, Dr1, Df1 for a period of a quarter clock cycle and output the logical state "HIGH" for the remaining times, and subsequently, the 4-input NAND gate 52 may receive only one valid data bit and three logical states "HIGH" at any quarter clock cycle and combine the data bits Dr0, Df0, Dr1, Df1 into the output data stream DQ. The multiplexer 14 may further comprise a keeper circuit configured to keep the output data stream DQ in a steady state during a standby mode.

Figure 6:
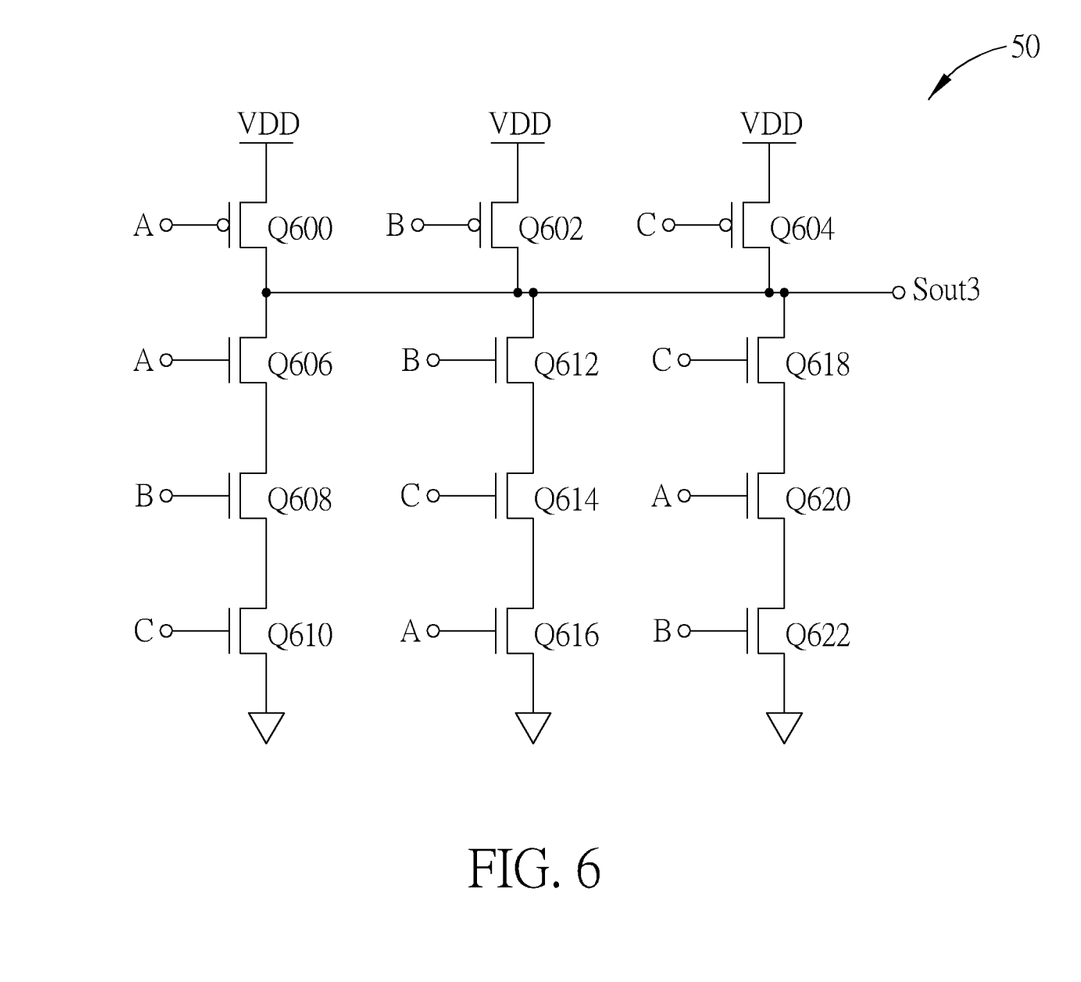
FIGS. 6 and 7 are respectively schematic diagrams of the matched 3-input NAND gates and the matched 4-input NAND gate of the multiplexer in FIG. 5.
Figure 7:
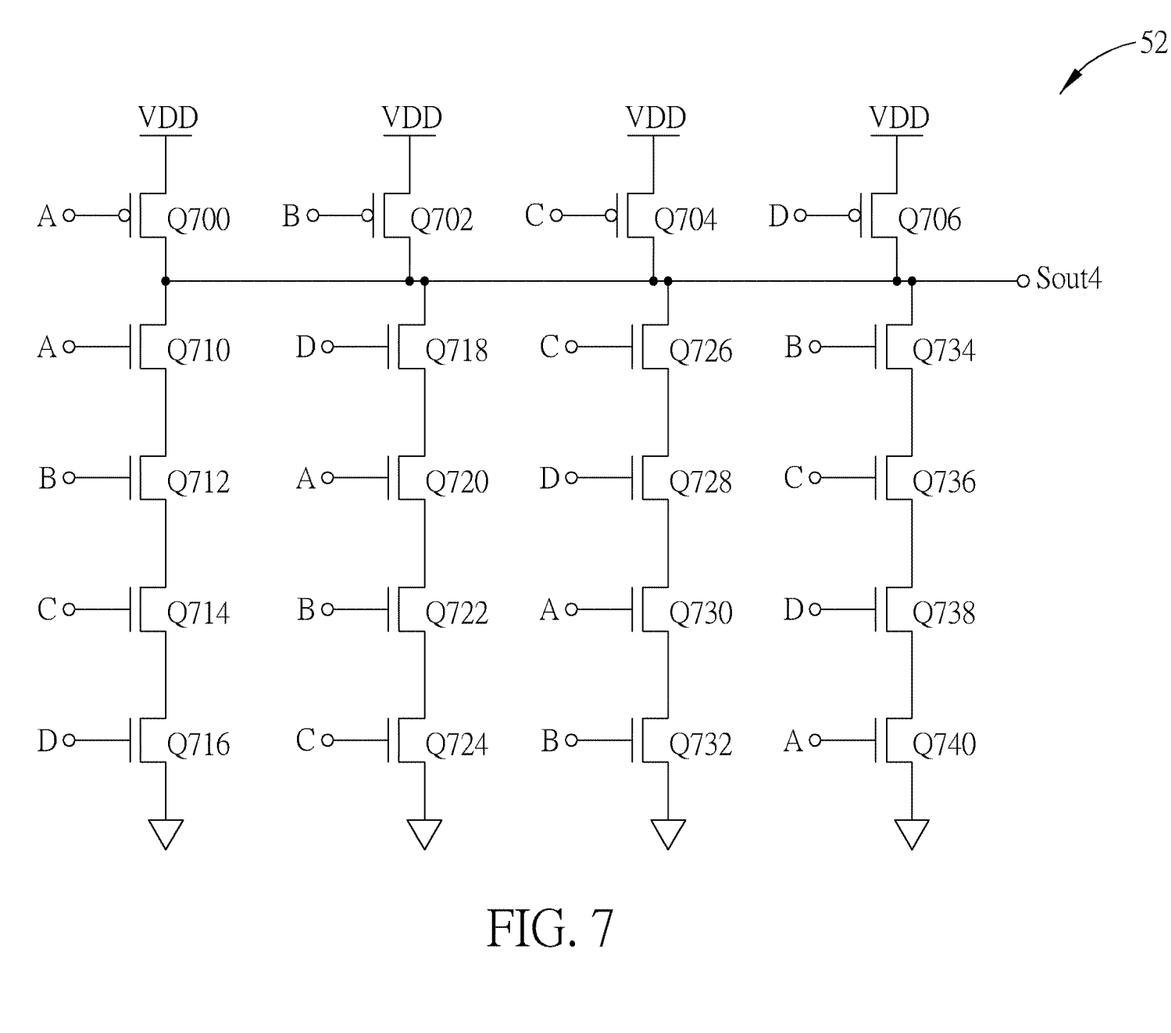

Moreover, the 3-input NAND gates 50*a* through 50*d* and the 4-input NAND gate 52 may be implemented in matched structure as shown in FIGS. 6 and 7, to compensate for differences in output response speeds due to input connections. In FIG. 6, input signals A, B, C of the 3-input NAND gate 50 are matched in pull-up paths and pull-down paths. The 3-input NAND gate 50 comprises 3 P-type metal-oxide-semiconductor field-effect transistors (MOSFET) Q600 through Q604 and 9 N-type MOSFETs Q606 through Q622. The 3 P-type MOSFETs Q600 through Q604 are coupled in parallel and each receive a respective input signal A, B, or C. The 9 N-type MOSFETs Q606 through Q622 are grouped into 3 groups coupled in parallel. Each group of N-type MOSFETs contains 3 N-type MOSFETs coupled in series and respectively referred to as a top N-type MOSFET, a middle N-type MOSFET and a bottom N-type MOSFET. The 3 groups of N-type MOSFETs may receive the input signals A, B and C in a matched manner, or each of the input signals A, B and C may be input to a top N-type MOSFET, a middle N-type MOSFET and a bottom N-type MOSFET of different groups of N-type MOSFETs. Using the matched structure, an output signal Sout3 may respond to the input signals A, B and C at approximately the same speed. Similarly, in FIG. 7, the 4-input NAND gate 52 comprises 4 P-type MOSFETs Q700 through Q706 and 16 N-type MOSFETs Q710 through Q740. Inputs of the 4-input NAND gate are matched in pull-up paths and pull-down paths, so that an output signal Sout4 may respond to input signals A, B, C and D at approximately the same speed.

Figure 8:
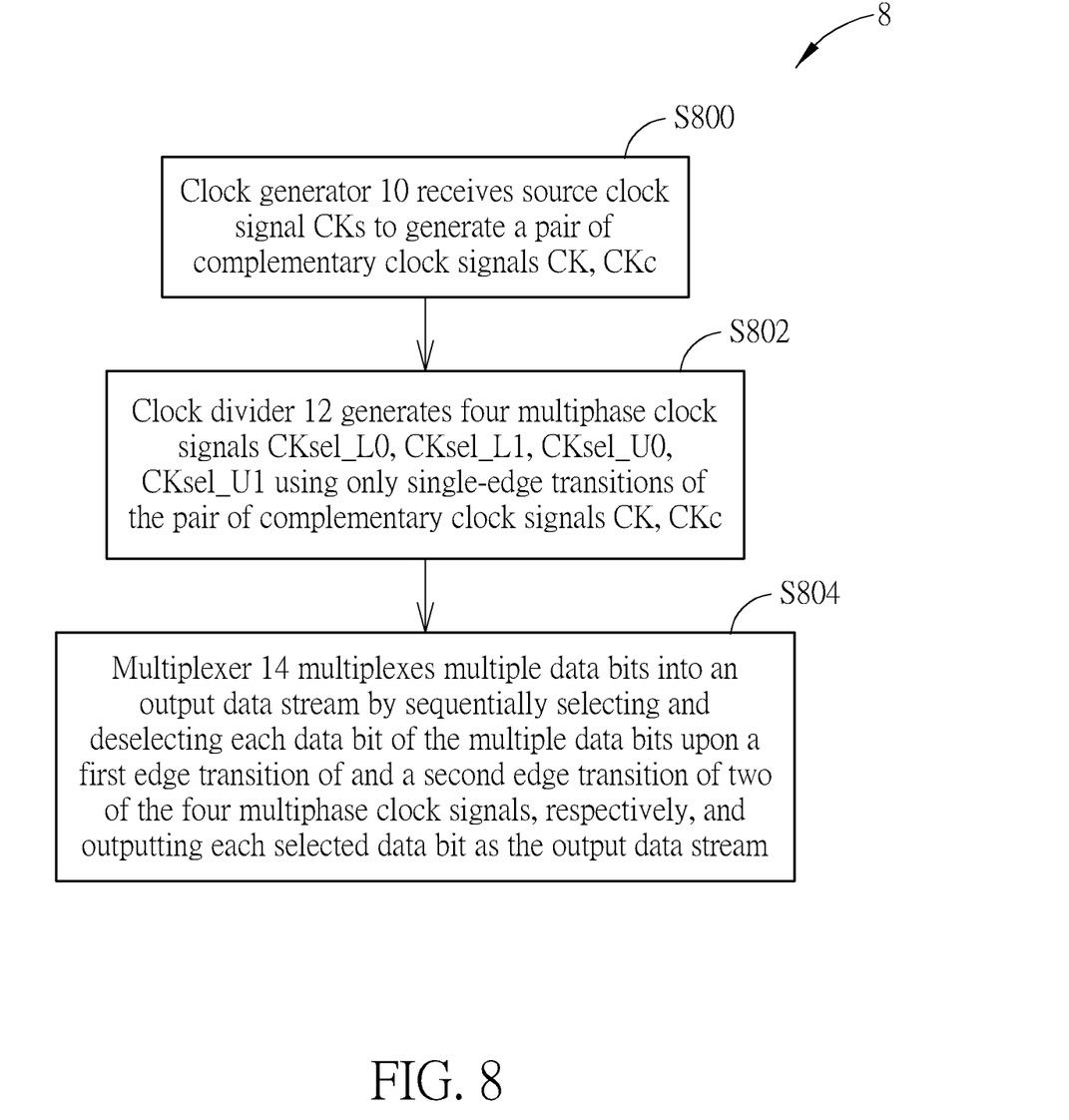
FIG. 8 is a flowchart of a data generation method adopted by the double data rate circuit in FIG. 1.

FIG. 8 is a flowchart of a data generation method 8 adopted by the DDR circuit 1 in FIG. 1. The data generation method 8 comprises Steps S800 through S804, and is used to implement precise duty cycle control for output data stream DQ. Any reasonable technological change or step adjustment is within the scope of the disclosure. Steps S800 through S804 are detailed as below:

Step S800: Clock generator 10 receives source clock signal CKs to generate a pair of complementary clock signals CK, CKc;

Step S802: Clock divider 12 generates four multiphase clock signals CKsel_L0, CKsel_L1, CKsel_U0, CKsel_U1 using only single-edge transitions of the pair of complementary clock signals CK, CKc;

Step S804: Multiplexer 14 multiplexes multiple data bits into an output data stream by sequentially selecting and deselecting each data bit of the multiple data bits upon a first edge transition of and a second edge transition of two of the four multiphase clock signals, respectively, and outputting each selected data bit as the output data stream.

Steps S800 through S804 are explained in detail in the preceding paragraphs, and description therefor is omitted for brevity.

Figure 9:
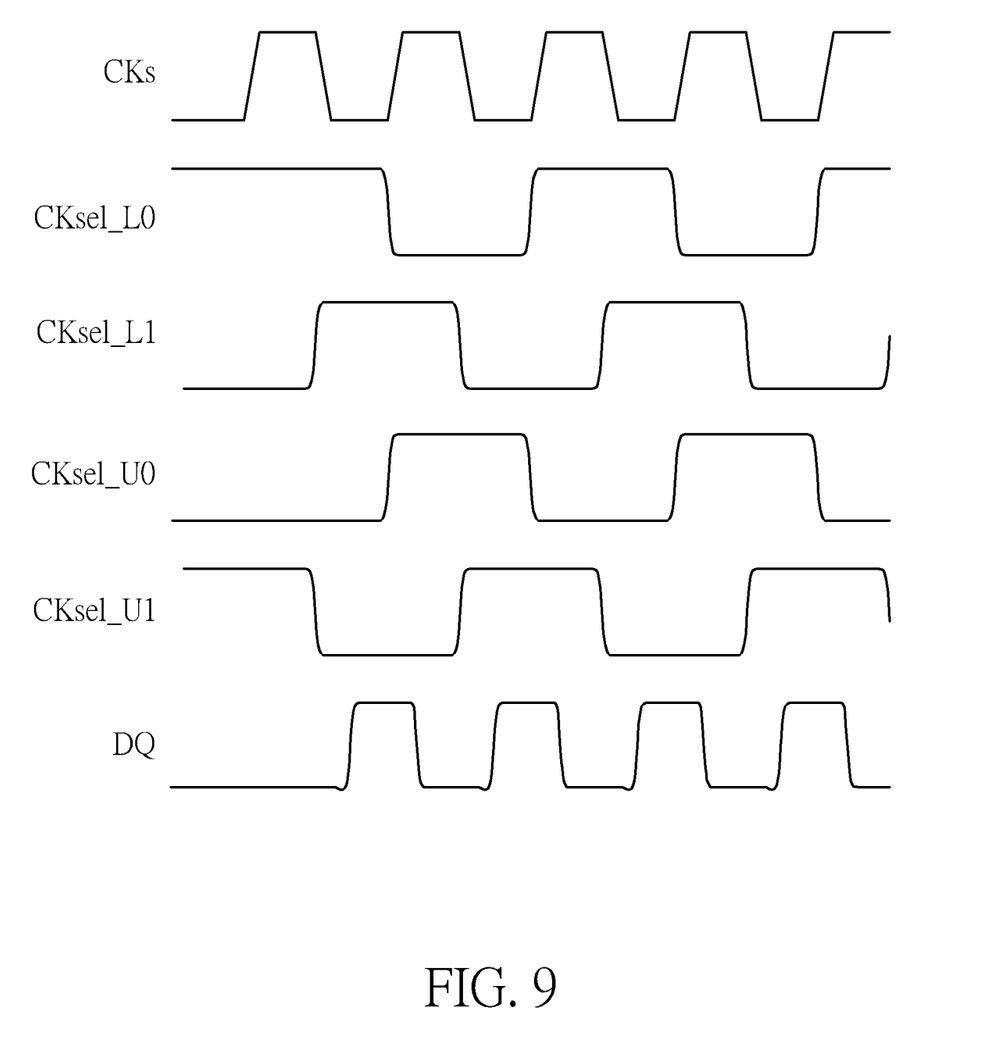
FIGS. 9 and 10 respectively show simulations of the DDR circuit in FIG. 1 and a conventional memory controller.
Figure 10:
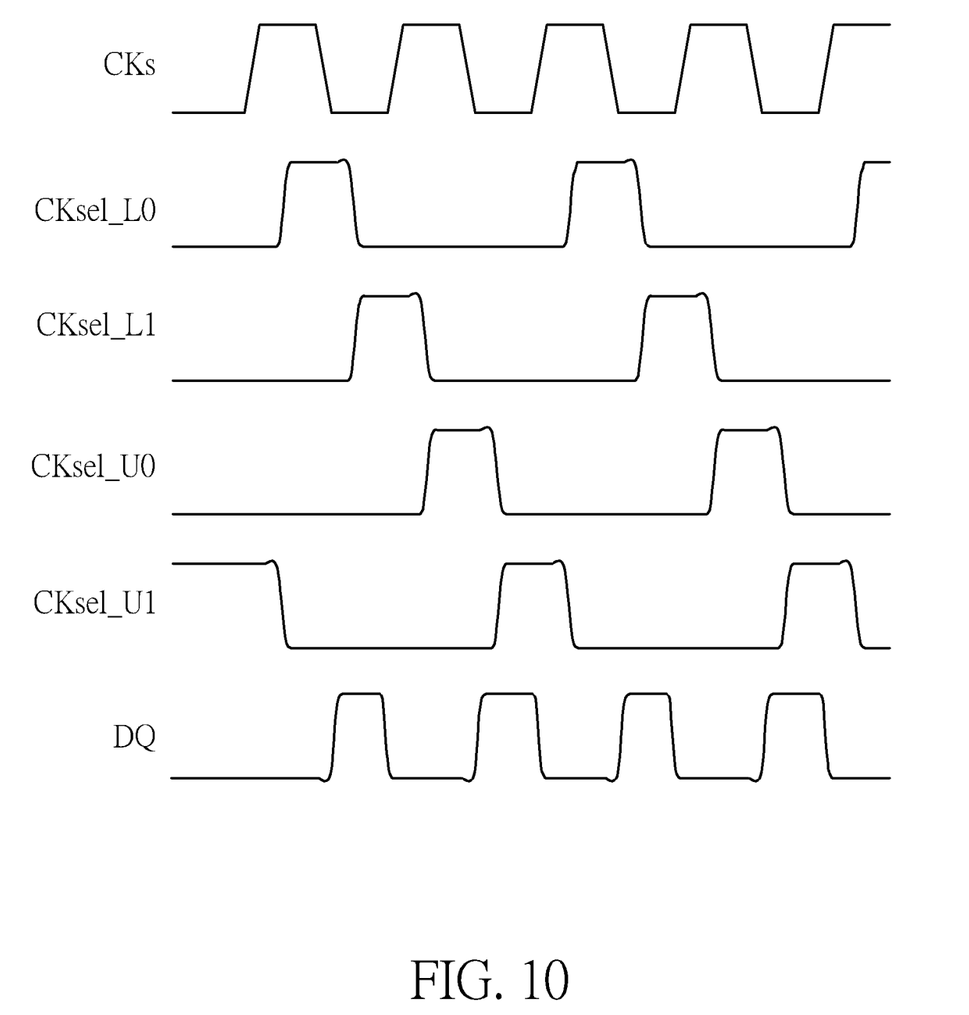

FIGS. 9 and 10 respectively show simulations of the DDR circuit 1 in FIG. 1 and a conventional memory controller. It can be seem that the DDR circuit 1 in the present invention may produce a duty cycle of 47.5% while the conventional memory controller produces a duty cycle of 36.4%.

Therefore, the DDR circuit 1 and the data generation method 8 can produce an enhanced duty cycle control, thereby satisfying timing requirements, decreasing a data skew, reducing an error rate and enhancing system performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A double data rate circuit comprising:
    a clock generator, configured to receive a source clock signal to generate a pair of complementary clock signals;
    a clock divider, coupled to the clock generator, and configured to generate four multiphase clock signals using only single-edge transitions of the pair of complementary clock signals, the four multiphase clock signals being successively out-of-phase by 90°; and
    a multiplexer, coupled to the clock divider, and configured to multiplex multiple data bits into an output data stream by sequentially selecting and deselecting each data bit of the multiple data bits upon a first edge transition of and a second edge transition of two of the four multiphase clock signals, respectively, and outputting each selected data bit as the output data stream;
    wherein the multiplexer comprises four 3-input NAND gates and one 4-input NAND gate coupled thereto;
    each of the four 3-input NAND gates is configured to receive one of four multiple data bits and two of the four multiphase clock signals, start outputting the received data bit upon the first edge transition of one of the two received multiphase clock signals, and stop outputting the received data bit upon the second edge transition of another one of the two received multiphase clock signals, the two received multiphase clock signals being out-of-phase by 90°;

the 4-input NAND gate is configured to receive respective output signals from the four 3-input NAND gates to generate the output data stream; and inputs of the 3-input NAND gates are matched in pull-up paths and pull-down paths, and inputs of the 4-input NAND gate are matched in pull-up paths and pull-down paths.

2. The circuit of claim 1, wherein:

the multiplexer is configured to select a first data bit of the multiple data bits as the output data stream upon the first edge transition of a first multiphase clock signal of the four multiphase clock signals, and deselect the first data bit of the multiple data bits as the output data stream upon the second edge transition of a second multiphase clock signal of the four multiphase clock signals; and the first multiphase clock signal and the second multiphase clock signal are out-of-phase by 90°.

3. The circuit of claim 1, wherein the first edge transition and the second edge transition are opposite clock edges.

4. The circuit of claim 1, wherein the first edge transition is a rising edge and the second edge transition is a falling edge.

5. The circuit of claim 1, wherein the clock generator comprises:

an even number of inverters coupled in series to generate one of the complementary clock signals;

an odd number of inverters coupled in series to generate another one of the complementary clock signals; and a sum of fan-outs of the even number of inverters is equal to a sum of fan-outs of the odd number of inverters.

6. The circuit of claim 1, wherein the clock divider comprises:

a first pair of cross-coupled flip-flops, configured to receive one of the complementary clock signals to generate two of the four multiphase clock signals opposite in phase; and a second pair of cross-coupled flip-flops, configured to receive another one of the complementary clock signals to generate another two of the four multiphase clock signals opposite in phase.

7. The circuit of claim 1, wherein the multiplexer further comprises a keeper circuit configured to keep the output data stream in a steady state during a standby mode.

8. A data generation method adopted by a double data rate circuit comprising a clock generator, a clock divider and a multiplexer, the data generation method comprising:

the clock generator receiving a source clock signal to generate a pair of complementary clock signals;

the clock divider generating four multiphase clock signals using only single-edge transitions of the pair of complementary clock signals, the four multiphase clock signals being out-of-phase by 90° with each other; and the multiplexer multiplexing multiple data bits into an output data stream by sequentially selecting and deselecting each data bit of the multiple data bits upon a first edge transition and a second edge transition of two of the four multiphase clock signals, respectively, and outputting each selected data bit as the output data stream;

wherein the multiplexer comprises four 3-input NAND gates and one 4-input NAND gate coupled thereto;

inputs of the 3-input NAND gates are matched in pull-up paths and pull-down paths, and inputs of the 4-input NAND gate are matched in pull-up paths and pull-down paths; and the method further comprises:

each of the four 3-input NAND gates receiving one of four multiple data bits and two of the four multiphase clock signals, starting outputting the received data bit upon the first edge transition of one of the two received multiphase clock signals, and stopping from outputting the received data bit upon the second edge transition of another one of the two received multiphase clock signals, the two received multiphase clock signals being out-of-phase by 90°; and the 4-input NAND gate receiving respective output signals from the four 3-input NAND gates to generate the output data stream.

9. The method of claim 8, further comprising:

the multiplexer selecting a first data bit of the multiple data bits as the output data stream upon the first edge transition of a first multiphase clock signal of the four multiphase clock signals; and the multiplexer deselecting the first data bit of the multiple data bits as the output data stream upon the second edge transition of a second multiphase clock signal of the four multiphase clock signals;

wherein the first multiphase clock signal and the second multiphase clock signal are out-of-phase by 90°.

10. The method of claim 8, wherein the first edge transition and the second edge transition are opposite clock edges.

11. The method of claim 8, wherein the first edge transition is a rising edge and the second edge transition is a falling edge.

12. The method of claim 8, wherein the clock generator comprises:

an even number of inverters coupled in series to generate one of the pair of complementary clock signals;

an odd number of inverters coupled in series to generate the other one of the pair of complementary clock signals; and a sum of fan-outs of the even number of inverters is equal to a sum of fan-outs of the odd number of inverters.

13. The method of claim 8, wherein:

the clock divider comprises a first pair of cross-coupled flip-flops and a second pair of cross-coupled flip-flops;

the method further comprises:

the first pair of cross-coupled flip-flops receiving one of the pair of complementary clock signals to generate two of the four multiphase clock signals opposite in phase; and the second pair of cross-coupled flip-flops receiving the other one of the pair of complementary clock signals to generate the other two of the four multiphase clock signals opposite in phase.

14. The method of claim 8, wherein the multiplexer further comprises a keeper circuit and the method further comprises the keeper circuit keeping the output data stream in a steady state during a standby mode.

15. A double data rate circuit comprising:

a clock generator, configured to receive a source clock signal to generate a pair of complementary clock signals;

a clock divider, coupled to the clock generator, and configured to generate four multiphase clock signals using only single-edge transitions of the pair of complementary clock signals, the four multiphase clock signals being successively out-of-phase by 90°; and a multiplexer, coupled to the clock divider, and configured to multiplex multiple data bits into an output data stream by sequentially selecting and deselecting each data bit of the multiple data bits upon a first edge transition and a second edge transition of two of the four multiphase clock signals, respectively, and outputting each selected data bit as the output data stream;

wherein the multiplexer comprises four 3-input NAND gates and one 4-input NAND gate coupled thereto;

each of the four 3-input NAND gates is configured to receive one of four multiple data bits and two of the four multiphase clock signals, start outputting the received data bit upon the first edge transition of one of the two received multiphase clock signals, and stop outputting the received data bit upon the second edge transition of another one of the two received multiphase clock signals, the two received multiphase clock signals being out-of-phase by 90°;

the 4-input NAND gate is configured to receive respective output signals from the four 3-input NAND gates to generate the output data stream;

inputs of the 3-input NAND gates are matched in pull-up paths and pull-down paths, and inputs of the 4-input NAND gate are matched in pull-up paths and pull-down paths; and each of the four 3-input NAND gates comprises:
- a first P-type transistor having a control terminal configured to receive a first input signal, a first terminal coupled to a power supply terminal, and a second terminal configured to output an output signal;
- a second P-type transistor having a control terminal configured to receive a second input signal, a first terminal coupled to the power supply terminal, and a second terminal configured to output the output signal;
- a third P-type transistor having a control terminal configured to receive a third input signal, a first terminal coupled to the power supply terminal, and a second terminal configured to output the output signal;
- a first N-type transistor having a control terminal configured to receive the first input signal, a first terminal coupled to the second terminal of the first P-type transistor, and a second terminal;
- a second N-type transistor having a control terminal configured to receive the second input signal, a first terminal coupled to the second terminal of the first N-type transistor, and a second terminal;
- a third N-type transistor having a control terminal configured to receive the third input signal, a first terminal coupled to the second terminal of the second N-type transistor, and a second terminal coupled to a ground terminal;
- a fourth N-type transistor having a control terminal configured to receive the second input signal, a first terminal coupled to the second terminal of the second P-type transistor, and a second terminal;
- a fifth N-type transistor having a control terminal configured to receive the third input signal, a first terminal coupled to the second terminal of the fourth N-type transistor, and a second terminal;
- a sixth N-type transistor having a control terminal configured to receive the first input signal, a first terminal coupled to the second terminal of the fifth N-type transistor, and a second terminal coupled to the ground terminal;
- a seventh N-type transistor having a control terminal configured to receive the third input signal, a first terminal coupled to the second terminal of the third P-type transistor, and a second terminal;
- an eighth N-type transistor having a control terminal configured to receive the first input signal, a first terminal coupled to the second terminal of the seventh N-type transistor, and a second terminal; and
- a ninth N-type transistor having a control terminal configured to receive the second input signal, a first terminal coupled to the second terminal of the eighth N-type transistor, and a second terminal coupled to the ground terminal.

* * * * *